United States Patent
Izumi

(10) Patent No.: US 9,401,525 B2
(45) Date of Patent: Jul. 26, 2016

(54) POWER STORAGE DEVICE AND MANUFACTURING METHOD THEREOF

(75) Inventor: Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 802 days.

(21) Appl. No.: 12/723,961

(22) Filed: Mar. 15, 2010

(65) Prior Publication Data

US 2010/0239907 A1 Sep. 23, 2010

(30) Foreign Application Priority Data

Mar. 20, 2009 (JP) .................................. 2009-069179

(51) Int. Cl.
*H01M 10/04* (2006.01)
*H01G 9/008* (2006.01)
(Continued)

(52) U.S. Cl.
CPC ........... *H01M 10/0436* (2013.01); *H01G 9/016* (2013.01); *H01G 9/155* (2013.01); *H01G 11/28* (2013.01); *H01G 11/56* (2013.01); *H01G 11/68* (2013.01); *H01G 11/80* (2013.01); *H01G 11/84* (2013.01); *H01M 4/661* (2013.01); (Continued)

(58) Field of Classification Search
CPC ....... H01G 9/016; H01G 9/155; H01G 11/28; H01G 11/56; H01G 11/68; H01G 11/80; H01G 11/84; H01M 10/0436; H01M 10/0525; H01M 4/661; Y02E 60/13; Y10T 29/49115
USPC ........... 429/220, 231.5, 218.1, 209, 122, 131, 429/139, 166, 171, 185
See application file for complete search history.

(56) References Cited

U.S. PATENT DOCUMENTS 4,611,034 A * 9/1986 Meyer et al. ................... 525/420
5,650,243 A * 7/1997 Ferment ......................... 429/162
(Continued)

FOREIGN PATENT DOCUMENTS

JP H03-084041 * 4/1991 ................. C08J 5/24
JP 10-284130 A 10/1998
(Continued)

OTHER PUBLICATIONS

Yoichi Hata; "Development of Integrated Manufacturing System for 50-um-Thick All-Solid-State Lithium-Ion Battery"; EETIMES Japan; Jan. 21, 2009; p. 1 with full English translation, Japan.

*Primary Examiner* — Patrick Ryan
*Assistant Examiner* — Aaron Greso
(74) *Attorney, Agent, or Firm* — Fish & Richardson P.C.

(57) ABSTRACT

A power storage device having a small thickness is manufactured. A manufacturing method of the power storage device includes: forming a first layer and a second layer over a first substrate; forming a first insulating layer, a positive electrode and a negative electrode over the second layer; forming a solid electrolyte layer over the first insulating layer, the positive electrode, and the negative electrode; forming a sealing layer to cover the solid electrolyte layer; forming a planarization film and a support over the sealing layer; separating the first layer and the second layer from each other so that the second layer, the positive electrode, the negative electrode, the solid electrolyte layer, the sealing layer, the planarization film, and the support are separated from the first substrate; attaching the separated structure to a second substrate which is flexible; and separating the support from the planarization film.

29 Claims, 3 Drawing Sheets

(51) Int. Cl.
*H01G 9/00* (2006.01)
*H01G 11/28* (2013.01)
*H01G 11/56* (2013.01)
*H01G 11/68* (2013.01)
*H01G 11/80* (2013.01)
*H01G 11/84* (2013.01)
*H01M 4/66* (2006.01)
*H01M 10/0525* (2010.01)

(52) U.S. Cl.
CPC ............ *H01M10/0525* (2013.01); *Y02E 60/13* (2013.01); *Y10T 29/49115* (2015.01)

(56) References Cited

U.S. PATENT DOCUMENTS

| | | | |
|---|---|---|---|
| 6,376,109 B1 | 4/2002 | Sano | |
| 6,749,649 B2 | 6/2004 | Sano | |
| 6,994,933 B1* | 2/2006 | Bates | ............ 429/162 |
| 7,147,971 B2 | 12/2006 | Okamoto et al. | |
| 7,235,330 B1 | 6/2007 | Fujimoto et al. | |
| 7,432,010 B2 | 10/2008 | Dokko | |
| 7,521,151 B2 | 4/2009 | Hwang et al. | |
| 7,592,099 B2 | 9/2009 | Tamura et al. | |
| 7,608,477 B2 | 10/2009 | Ikeda | |
| 8,367,440 B2 | 2/2013 | Takayama | |
| 8,415,208 B2 | 4/2013 | Takayama | |
| 2002/0090537 A1 | 7/2002 | Sano | |
| 2002/0122985 A1 | 9/2002 | Sato et al. | |
| 2004/0096745 A1 | 5/2004 | Shibano et al. | |
| 2005/0225930 A1* | 10/2005 | Stieglbauer et al. | .......... 361/523 |
| 2007/0048619 A1 | 3/2007 | Inda | |
| 2007/0059584 A1 | 3/2007 | Nakano et al. | |
| 2007/0082265 A1* | 4/2007 | Itou et al. | ............ 429/223 |
| 2007/0087269 A1 | 4/2007 | Inda | |
| 2007/0231704 A1 | 10/2007 | Inda | |
| 2008/0032236 A1* | 2/2008 | Wallace et al. | ............ 430/319 |
| 2008/0105670 A1* | 5/2008 | Wolfel | ............ 219/543 |
| 2008/0241665 A1 | 10/2008 | Sano | |
| 2008/0297981 A1 | 12/2008 | Endo et al. | |
| 2008/0311480 A1 | 12/2008 | Sano | |
| 2011/0300451 A1 | 12/2011 | Inda | |
| 2013/0214324 A1 | 8/2013 | Takayama | |

FOREIGN PATENT DOCUMENTS

| | | | | |
|---|---|---|---|---|
| JP | 2000-090923 A | 3/2000 | | |
| JP | 2000-106195 A | 4/2000 | | |
| JP | 2000-251852 A | 9/2000 | | |
| JP | 2002-042863 A | 2/2002 | | |
| JP | 2002-289174 A | 10/2002 | | |
| JP | 2003-174153 A | 6/2003 | | |
| JP | 2004-031316 A | 1/2004 | | |
| JP | 2004-158222 A | 6/2004 | | |
| JP | 2004-183078 A | 7/2004 | | |
| JP | 2005-108638 A | 4/2005 | | |
| JP | 2005-340078 A | 12/2005 | | |
| JP | 2006-156284 A | 6/2006 | | |
| JP | 2006-185913 A | 7/2006 | | |
| JP | 2007-123081 A | 5/2007 | | |
| JP | 2007-134305 A | 5/2007 | | |
| JP | 2007-220377 A | 8/2007 | | |
| JP | 2007-273459 A | 10/2007 | | |
| JP | 2007-299580 A | 11/2007 | | |
| JP | 2007-324079 A | 12/2007 | | |
| JP | 2008-171599 | * | 7/2008 | ............ Y02E 60/122 |
| JP | 2008-171599 A | | 7/2008 | |
| JP | 2008-198492 A | | 8/2008 | |
| JP | 2008-294314 A | | 12/2008 | |
| JP | 2009-301727 A | | 12/2009 | |
| WO | WO-2005/004567 | | 1/2005 | |
| WO | 2006/054779 A1 | | 5/2006 | |
| WO | WO 2009/108185 | * | 9/2009 | ............ H01M 10/04 |

\* cited by examiner

POWER STORAGE DEVICE AND MANUFACTURING METHOD THEREOF

BACKGROUND OF THE INVENTION

1. Field of the Invention

The present invention disclosed in this specification relates to power storage devices.

2. Description of the Related Art

In recent years, power storage devices such as lithium-ion secondary batteries where carbon or lithium metal oxide is used as a battery material and which are charged and discharged by the movement of lithium ions as carrier ions between a positive electrode and a negative electrode, and electrochemical capacitors, have been actively developed (see Patent Documents 1 to 3).

Further, among such lithium-ion secondary batteries, all-solid-state lithium-ion secondary batteries in which a solid electrolyte is used instead of a liquid electrolyte have been developed (see Patent Documents 4 to 6 and Non-Patent Document 1).

REFERENCES

Patent Documents

[Patent Document 1] Japanese Published Patent Application No. 2008-294314
[Patent Document 2] Japanese Published Patent Application No. 2002-289174
[Patent Document 3] Japanese Published Patent Application No. 2007-299580
[Patent Document 4] Japanese Published Patent Application No. 2004-158222
[Patent Document 5] Japanese Published Patent Application No. 2006-185913
[Patent Document 6] Japanese Published Patent Application No. 2007-134305

Non-Patent Document

[Non-Patent Document 1] Yoichiro Hata, "Development of integrated production equipment for 50 μm thick, all-solid-state lithium-ion batteries," EE Times Japan, Jan. 21, 2009, http://eetimes.jp/article/22693

SUMMARY OF THE INVENTION

In formation of an all-solid-state power storage device, the device should be formed over a thick substrate such as a glass substrate or a silicon substrate. Such substrates are thick, and thus the power storage devices formed over such substrates are also thick. Therefore, it is an object of one embodiment of the present invention disclosed in this specification to reduce the thickness of a power storage device.

It is also an object of one embodiment of the present invention disclosed in this specification to reduce the size, thickness, and weight of an electric device which incorporates the power storage device.

After a power storage device is formed over a thick substrate such as a glass substrate or a silicon substrate, the power storage device is separated from the substrate and the separated power storage device is attached to a flexible substrate. In this manner, a thin power storage device is manufactured.

One embodiment of the present invention is a power storage device including a positive electrode and a negative electrode over a flexible substrate, the positive electrode including a positive-electrode current collecting layer and a positive-electrode active material layer over the positive-electrode current collecting layer, and the negative electrode including a negative-electrode current collecting layer and a negative-electrode active material layer over the negative-electrode current collecting layer; a solid electrolyte layer over the substrate, the positive-electrode active material layer, and the negative-electrode active material layer; and a sealing layer covering the positive-electrode active material layer, the negative-electrode active material layer, and the solid electrolyte layer.

One embodiment of the present invention is a method for manufacturing a power storage device, comprising the steps of: forming, over a first substrate, a first layer and a second layer which have low adhesiveness to each other; forming a first insulating layer over the second layer; forming a positive-electrode current collecting layer and a negative-electrode current collecting layer over the first insulating layer; forming a positive-electrode active material layer and a negative-electrode active material layer over the positive-electrode current collecting layer and the negative-electrode current collecting layer, respectively, wherein the positive-electrode current collecting layer and the positive-electrode active material layer serve as a positive electrode, and the negative-electrode current collecting layer and the negative-electrode active material layer serve as a negative electrode; forming a solid electrolyte layer over the first insulating layer, the positive electrode, and the negative electrode; forming a sealing layer to cover the solid electrolyte layer; forming a planarization film and a support over the sealing layer; separating the first layer and the second layer from each other so that the second layer, the positive electrode, the negative electrode, the solid electrolyte layer, the sealing layer, the planarization film, and the support are separated from the first substrate; attaching the second layer, the positive electrode, the negative electrode, the solid electrolyte layer, the sealing layer, the planarization film, and the support which have been separated from the first substrate to a second substrate which is flexible; and separating the support from the planarization film.

According to one embodiment of the present invention disclosed in this specification, a power storage device having a small thickness can be manufactured. Further, by incorporating such a power storage device having a small thickness, a miniaturized electric device can be manufactured.

DETAILED DESCRIPTION OF THE INVENTION

Figure 1A:
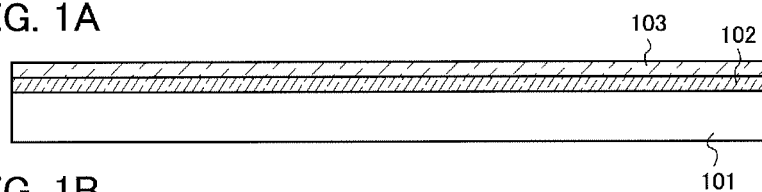
FIGS. 1A to 1E are cross-sectional views of a manufacturing process of a power storage device.

Embodiments of the present invention disclosed in this specification will be hereinafter described with reference to the accompanying drawings. Note that the present invention disclosed in this specification can be carried out in a variety of different modes, and it is easily understood by those skilled in the art that the modes and details of the present invention disclosed in this specification can be changed in various ways without departing from the spirit and scope thereof. Therefore, the present invention disclosed in this specification should not be interpreted as being limited to the description in the embodiments. Note that in the accompanying drawings, the same portions or portions having similar functions are denoted by the same reference numerals, and repetitive description thereof is omitted.

Embodiment 1

This embodiment will be described with reference to FIGS. 1A to 1E, FIGS. 2A to 2C, and FIG. 3.

First, a first layer 102 and a second layer 103 which have low adhesiveness to each other are formed over a substrate 101 (FIG. 1A).

The substrate 101 can be a glass substrate, a quartz substrate, a plastic substrate, or the like having an insulating surface. Additionally, a conductive substrate of metal or the like or a substrate in which an insulating film is formed over a semiconductor substrate of silicon or the like can be used.

At the interface between the first layer 102 and the second layer 103 which have low adhesiveness to each other, the first layer 102 and the second layer 103 can be separated from each other, so that the substrate 101 and the first layer 102 can be separated from a stacked structure formed over the second layer 103.

Examples of the combination of the first layer 102 and the second layer 103 which have low adhesiveness to each other include a combination of a metal film and a silicon oxide film, and the like. Specifically, a tungsten film may be formed as the first layer 102 and a silicon oxide film or the like may be formed over the first layer 102 by a sputtering method as the second layer 103.

In addition, the first layer 102 and the second layer 103 do not necessarily need to originally have low adhesiveness to each other, and a combination of films whose adhesiveness can be lowered by a certain process after formation of the films may be used. For example, an amorphous silicon film as the first layer 102 and a silicon oxide film as the second layer 103 are stacked, the formed films are subjected to heating or laser irradiation from the rear face side of the substrate 101, so that the amorphous silicon film is crystallized to lower the adhesiveness between the first layer 102 and the second layer 103.

Figure 1B:
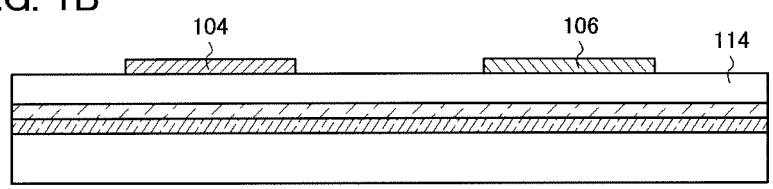

Then, an insulating layer 114 is formed over the second layer 103. A positive-electrode current collecting layer 104 and a negative-electrode current collecting layer 106 are formed over the insulating layer 114 (FIG. 1B).

In this embodiment, the positive-electrode current collecting layer 104 and the negative-electrode current collecting layer 106 are each formed using a metal film of platinum (Pt), titanium (Ti), aluminum (Al), copper (Cu), gold (Au), or the like by a sputtering method.

Figure 1C:
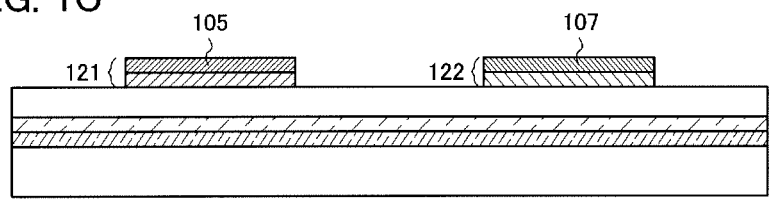

A positive-electrode active material layer 105 is formed over the positive-electrode current collecting layer 104 and a negative-electrode active material layer 107 is formed over the negative-electrode current collecting layer 106 (FIG. 1C). The positive-electrode current collecting layer 104 and the positive-electrode active material layer 105 are referred to as a positive electrode 121, while the negative-electrode current collecting layer 106 and the negative-electrode active material layer 107 are referred to as a negative electrode 122. In this embodiment, as each of the positive-electrode active material layer 105 and the negative-electrode active material layer 107, a film of carbon (C) is formed by a sputtering method. Graphite can be given as an example of carbon (C).

The positive-electrode active material layer 105 may be formed using a lithium-containing composite oxide represented by a chemical formula $Li_xM_yO_2$ (wherein M represents Co, Ni, Mn, V, Fe, or Ti, and x is in the range of from 0.2 to 2.5 and y is in the range of from 0.8 to 1.25), such as $LiCoO_2$ or $LiNiO_2$. Note that in the case where the aforementioned lithium-containing composite oxide represented by the chemical formula $Li_xM_yO_2$ is used for the positive-electrode active material layer 105 of a lithium-ion secondary battery, M may include either one element or two or more elements. In other words, for the positive-electrode active material layer 105 of a lithium-ion secondary battery, a multi-element, lithium-containing composite oxide may be used.

Furthermore, for the positive-electrode active material layer 105, a metal compound (oxide, sulfide, or nitride) having a layered structure can be used.

In the case where a lithium-containing composite oxide represented by $Li_xM_yO_2$ or a metal compound having a layered structure is used for the positive-electrode active material layer 105, a power storage device of this embodiment functions as a secondary battery.

Next, in the case where a capacitor is manufactured as a power storage device, the carbon film which is formed as the positive-electrode active material layer 105 is processed into activated carbon by steam activation or alkali activation.

In addition, in the case where a capacitor is manufactured as a power storage device, a lithium film 115 is formed over the negative-electrode active material layer 107, whereby lithium ions of the lithium film 115 are added to the negative-electrode active material layer 107 so that the negative-electrode active material layer 107 is doped with the lithium ions. By doping the negative-electrode active material layer 107 with lithium ions, lithium ions serving as carrier ions can be introduced in advance, and a larger number of ions can be used as carrier ions.

The carrier ions are not limited to lithium ions and may be other alkali metal ions or alkaline earth metal ions. The other alkali metal ions may be sodium (Na) ions, and the alkaline earth metal ions may be magnesium (Mg) ions or calcium (Ca) ions.

In order to introduce the other alkali metal ions or alkaline earth metal ions into the negative-electrode active material layer 107 as carrier ions in the above manner, a film for ions serving as carrier ions may be formed over the negative-electrode active material layer 107, whereby the ions in the formed film may be added to the negative-electrode active material layer 107 so that the negative-electrode active material layer 107 is doped with the ions, as in the case of lithium ions.

Figure 1D:
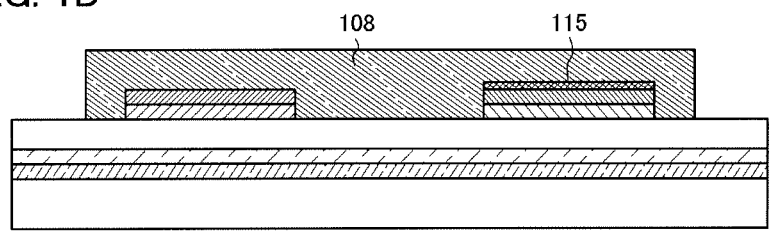

Next, a solid electrolyte layer 108 is formed between the positive electrode 121 and the negative electrode 122 (FIG. 1D).

In this embodiment, sputtering of lithium phosphate ($Li_3PO_4$) is conducted in a nitrogen atmosphere to form a film of lithium phosphorous oxynitride (LiPON) having a thickness of about 1.0 μm as the solid electrolyte layer 108. Alternatively, lithium hexafluorophosphate ($LiPF_6$), lithium fluoroborate ($LiBF_4$), or the like may be used instead of lithium phosphate.

The solid electrolyte layer 108 should not be damaged by plasma during the film formation by sputtering.

The solid electrolyte layer 108 may be amorphous or crystalline. Furthermore, for the solid electrolyte layer, a polymer electrolyte or a gel electrolyte may be used.

Figure 1E:
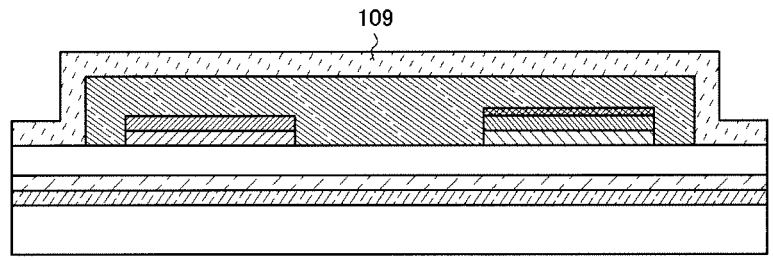

A sealing layer 109 is formed to cover the positive electrode 121, the negative electrode 122, and the solid electrolyte layer 108 (FIG. 1E). The sealing layer 109 is preferably formed using a material which contains no oxygen. In addition, moisture or oxygen should be prevented from entering the sealing layer 109. As the sealing layer 109, for example, a polyurea resin film may be used.

Figure 2A:
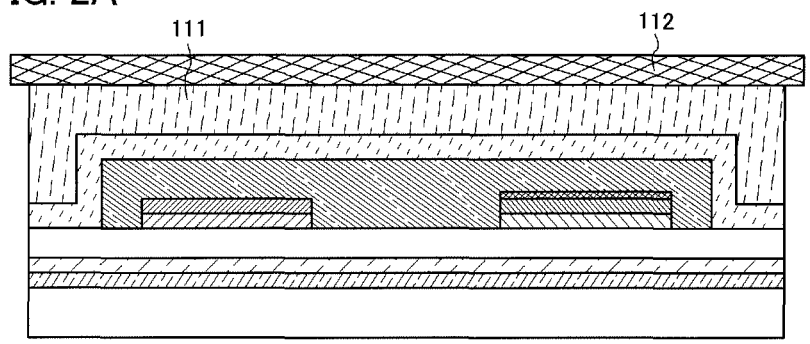
FIGS. 2A to 2C are cross-sectional views of a manufacturing process of a power storage device.
Figure 2B:
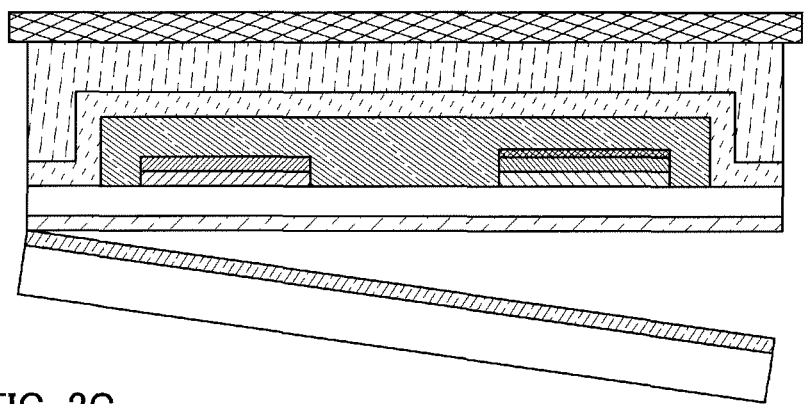

Next, a planarization film 111 is formed over the sealing layer 109, and a support 112 is formed over the planarization film 111 (FIG. 2A). In this embodiment, as the planarization film 111, an organic resin such as an epoxy resin or a structure in which a fibrous body is impregnated with an organic resin (also referred to as a "prepreg") is used.

The support 112 can be a substrate to which a thermoplastic resin or a photoplastic resin is applied as an adhesive. In addition, the support 112 itself is also preferably a flexible substrate, in which case a power storage device or the like is not damaged when separated from the substrate.

Then, the positive electrode 121, the negative electrode 122, the solid electrolyte layer 108, the sealing layer 109, the planarization film 111, and the support 112 are separated from the substrate 101 (FIG. 2A). Note that the separation is brought in the interface between the first layer 102 and the second layer 103 which have low adhesiveness to each other.

Figure 2C:
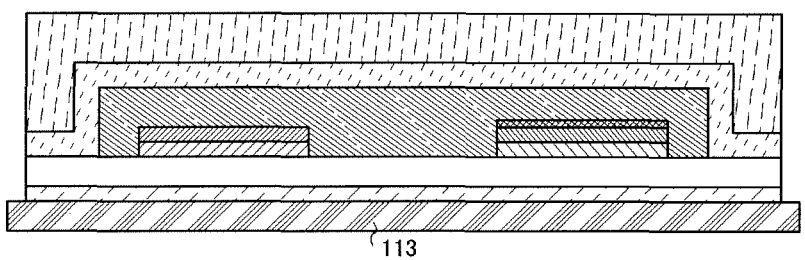

The positive electrode 121, the negative electrode 122, the solid electrolyte layer 108, the sealing layer 109, the planarization film 111, and the support 112 which have been separated from the substrate 101 are attached to a flexible substrate 113. Then, the support 112 is separated from the planarization film 111 (FIG. 2C). Through the above manufacturing process, the power storage device is manufactured over the flexible substrate 113.

Figure 3:
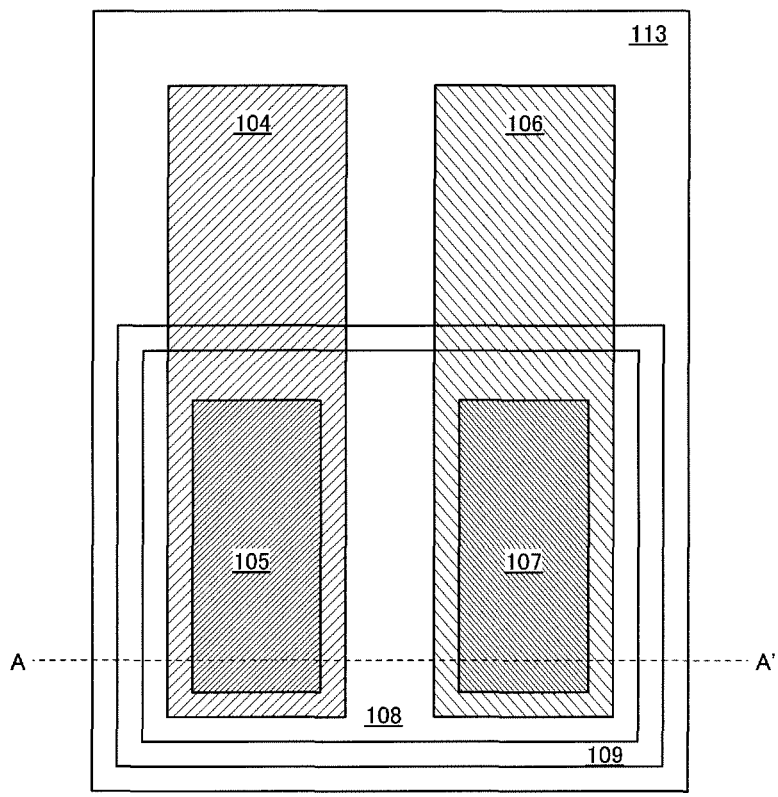
FIG. 3 is a top view of a manufacturing process of a power storage device.

FIG. 3 is a top view of the power storage device over the flexible substrate 113. The positive-electrode current collecting layer 104 and the negative-electrode current collecting layer 106 extend outside the sealing layer 109. The extending portions of the positive-electrode current collecting layer 104 and the negative-electrode current collecting layer 106 may each be electrically connected to an external terminal. In addition, the cross-sectional view taken along the line A-A' in FIG. 3 is FIG. 2C.

In one embodiment of the present invention disclosed in this specification, after a power storage device is formed over a thick substrate, the power storage device is separated from the substrate and the separated power storage device is attached to a thin substrate, as described above. In this manner, a power storage device having a small thickness can be manufactured.

This application is based on Japanese Patent Application serial no. 2009-069179 filed with Japan Patent Office on Mar. 20, 2009, the entire contents of which are hereby incorporated by reference.

What is claimed is:

1. A power storage device comprising:
   a flexible substrate;
   a first insulating layer on a first surface of the flexible substrate;
   a second insulating layer on the first insulating layer;
   a positive electrode on the second insulating layer, the positive electrode including:
   a positive-electrode current collecting layer over and in contact with a first region of an upper surface of the second insulating layer; and
   a positive-electrode active material layer on the positive-electrode current collecting layer;
   a negative electrode on the second insulating layer, the negative electrode including:
      a negative-electrode current collecting layer over and in contact with a second region of the upper surface of the second insulating layer; and
      a negative-electrode active material layer on the negative-electrode current collecting layer;
   a solid electrolyte layer over and in contact with a third region of the upper surface of the second insulating layer, the solid electrolyte layer covering an upper surface and a side surface of the positive electrode and an upper surface and a side surface of the negative electrode; and
   a sealing layer covering the solid electrolyte layer,
   wherein the third region is positioned between the first region and the second region of the upper surface of the second insulating layer.

2. The power storage device according to claim 1, wherein the power storage device is an all-solid-state power storage device.

3. The power storage device according to claim 1, wherein the positive-electrode current collecting layer comprises a material selected from the group consisting of platinum, titanium, aluminum, copper, and gold.

4. The power storage device according to claim 1, wherein the negative-electrode current collecting layer comprises a material selected from the group consisting of platinum, titanium, aluminum, copper, and gold.

5. The power storage device according to claim 1, further comprising a planarization film over the sealing layer.

6. The power storage device according to claim 5, wherein the planarization film comprises an organic resin.

7. The power storage device according to claim 5, wherein the planarization film is a structure in which a fibrous body is impregnated with an organic resin.

8. The power storage device according to claim 1, wherein the sealing layer is in contact with the upper surface of the second insulating layer.

9. The power storage device according to claim 1, wherein the first insulating layer comprises silicon oxide.

10. A power storage device comprising:
    a flexible substrate;
    a silicon oxide layer on a first surface of the flexible substrate;
    an insulating layer on the silicon oxide layer;
    a positive electrode over and in contact with a first region of an upper surface of the insulating layer;
    a negative electrode over and in contact with a second region of the upper surface of the insulating layer;
    a solid electrolyte layer over and in contact with a third region of the upper surface of the insulating layer, the solid electrolyte layer covering an upper surface and a side surface of the positive electrode and an upper surface and a side surface of the negative electrode; and
    a sealing layer covering the solid electrolyte layer,
    wherein the third region is positioned between the first region and the second region of the upper surface of the insulating layer.

11. The power storage device according to claim 10, wherein the power storage device is an all-solid-state power storage device.

12. The power storage device according to claim 10, further comprising a planarization film over the sealing layer.

13. The power storage device according to claim 12, wherein the planarization film comprises an organic resin.

14. The power storage device according to claim 12, wherein the planarization film is a structure in which a fibrous body is impregnated with an organic resin.

15. The power storage device according to claim 10, wherein the sealing layer is in contact with the upper surface of the insulating layer.

16. The power storage device according to claim 10, wherein the negative electrode includes a lithium film.

17. A power storage device comprising:
    a flexible substrate;

a silicon oxide layer on a first surface of the flexible substrate;
an insulating layer on the silicon oxide layer;
a positive electrode over and in contact with a first region of an upper surface of the insulating layer, the positive electrode including a positive-electrode current collecting layer and a positive-electrode active material layer;
a negative electrode over and in contact with a second region of the upper surface of the insulating layer, the negative electrode including a negative-electrode current collecting layer and a negative-electrode active material layer;
a solid electrolyte layer on and in contact with a third region of the upper surface of the insulating layer, an upper surface and a side surface of the positive electrode, and an upper surface and a side surface of the negative electrode; and
a sealing layer and the insulating layer surrounding the positive electrode, the negative electrode, and the solid electrolyte layer,
wherein the third region is positioned between the first region and the second region of the upper surface of the insulating layer.

18. The power storage device according to claim 17, wherein the power storage device is an all-solid-state power storage device.

19. The power storage device according to claim 17, wherein the positive-electrode current collecting layer comprises a material selected from the group consisting of platinum, titanium, aluminum, copper, and gold.

20. The power storage device according to claim 17, wherein the negative-electrode current collecting layer comprises a material selected from the group consisting of platinum, titanium, aluminum, copper, and gold.

21. The power storage device according to claim 17, further comprising a planarization film over the sealing layer.

22. The power storage device according to claim 21, wherein the planarization film comprises an organic resin.

23. The power storage device according to claim 21, wherein the planarization film is a structure in which a fibrous body is impregnated with an organic resin.

24. The power storage device according to claim 17, wherein the sealing layer is in contact with the upper surface of the insulating layer.

25. The power storage device according to claim 17, wherein the negative electrode further includes a lithium film on the negative-electrode active material layer.

26. The power storage device according to claim 1, wherein the negative electrode further includes a lithium film on the negative-electrode active material layer.

27. The power storage device according to claim 1, wherein the upper surface of the second insulating layer is parallel to the first surface of the flexible substrate.

28. The power storage device according to claim 10, wherein the upper surface of the insulating layer is parallel to the first surface of the flexible substrate.

29. The power storage device according to claim 17, wherein the upper surface of the insulating layer is parallel to the first surface of the flexible substrate.

* * * * *